(12) United States Patent
Kawahara et al.

(10) Patent No.: US 9,450,082 B2
(45) Date of Patent: Sep. 20, 2016

(54) INTEGRATED TERMINATION FOR MULTIPLE TRENCH FIELD PLATE

(71) Applicant: Texas Instruments Incorporated, Dallas, TX (US)

(72) Inventors: Hideaki Kawahara, Plano, TX (US); Christopher Boguslaw Kocon, Mountain Top, PA (US); Simon John Molloy, Allentown, PA (US); Jayhoon Chung, Plano, TX (US); John Manning Savidge Neilson, Norristown, PA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 50 days.

(21) Appl. No.: 14/299,051

(22) Filed: Jun. 9, 2014

(65) Prior Publication Data
US 2015/0357461 A1    Dec. 10, 2015

(51) Int. Cl.
| | |
|---|---|
| *H01L 29/78* | (2006.01) |
| *H01L 29/10* | (2006.01) |
| *H01L 29/66* | (2006.01) |
| *H01L 29/06* | (2006.01) |
| *H01L 29/40* | (2006.01) |
| *H01L 29/417* | (2006.01) |
| *H01L 29/08* | (2006.01) |
| *H01L 29/423* | (2006.01) |

(52) U.S. Cl.
CPC ......... *H01L 29/7811* (2013.01); *H01L 29/407* (2013.01); *H01L 29/66712* (2013.01); *H01L 29/0878* (2013.01); *H01L 29/41766* (2013.01); *H01L 29/42376* (2013.01); *H01L 29/66727* (2013.01); *H01L 29/7813* (2013.01)

(58) Field of Classification Search
None
See application file for complete search history.

(56) References Cited

U.S. PATENT DOCUMENTS 8,796,787 B2 *  8/2014  Tamaki ................... H01L 24/05
257/288

* cited by examiner

*Primary Examiner* — Robert Carpenter
(74) *Attorney, Agent, or Firm* — Tuenlap D. Chan; Frank D. Cimino

(57) ABSTRACT

A semiconductor device includes a vertical MOS transistor with a plurality of parallel RESURF drain trenches separated by a constant spacing in a vertical drain drift region. The vertical MOS transistor has chamfered corners; each chamfered corner extends across at least five of the drain trenches. A RESURF termination trench surrounds the drain trenches, separated from sides and ends of the drain trenches by distances which are functions of the drain trench spacing. At the chamfered corners, the termination trench includes external corners which extend around an end of a drain trench which extends past an adjacent drain trench, and includes internal corners which extend past an end of a drain trench which is recessed from an adjacent drain trench. The termination trench is separated from the drain trenches at the chamfered corners by distances which are also functions of the drain trench spacing.

11 Claims, 14 Drawing Sheets

US 9,450,082 B2

INTEGRATED TERMINATION FOR MULTIPLE TRENCH FIELD PLATE

FIELD OF THE INVENTION

This invention relates to the field of semiconductor devices. More particularly, this invention relates to vertical MOS transistors in semiconductor devices.

BACKGROUND OF THE INVENTION

A vertical metal oxide semiconductor (MOS) transistor with parallel RESURF trenches in the drain drift region has chamfered corners to reduce stress on the portions of the vertical MOS transistor nears corners of the substrate. The parallel RESURF trenches are surrounded by a RESURF termination trench. The vertical MOS transistor experiences premature breakdown and breakdown instability due to uncontrolled regions of the substrate inside the termination trench at the chamfers.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A semiconductor device includes a vertical MOS transistor with a plurality of drain trenches in a vertical drain drift region over a drain contact region. The drain trenches are arranged parallel to each other. Each drain trench has a RESURF configuration, and includes a dielectric liner contacting the vertical drain drift region and a field plate inside the dielectric liner. Adjacent drain trenches are separated by a substantially constant spacing. The vertical MOS transistor has chamfered corners; each chamfered corner extends across at least five of the drain trenches. A termination trench having a RESURF configuration surrounds the drain trenches. The termination trench is separated from outer instances of the drain trenches by a distance of 80 percent to 120 percent of the spacing between the drain trenches. The termination trench is separated from ends of instances of the drain trenches, located away from the chamfered corners, by a distance of 50 percent to 90 percent of the spacing between the drain trenches. At the chamfered corners, the termination trench includes external corners which extend around an end of a drain trench which extends past an adjacent drain trench. At the chamfered corners, the termination trench also includes internal corners which extend past an end of a drain trench which is recessed from an adjacent drain trench. At the chamfered corners, the external corners and internal corners alternate in series. At each chamfered corner, the termination trench includes at least three external corners and at least two internal corners.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

For the purposes of this description, the term "RESURF" will be understood to refer to a structure which reduces an electric field in an adjacent semiconductor region. A RESURF region may be, for example, a dielectric layer contacting the semiconductor region and a field plate separated from the semiconductor region by the dielectric layer. RESURF structures are described in Appels, et al., "Thin Layer High Voltage Devices" Philips J, Res. 35 1-13, 1980.

Figure 1:
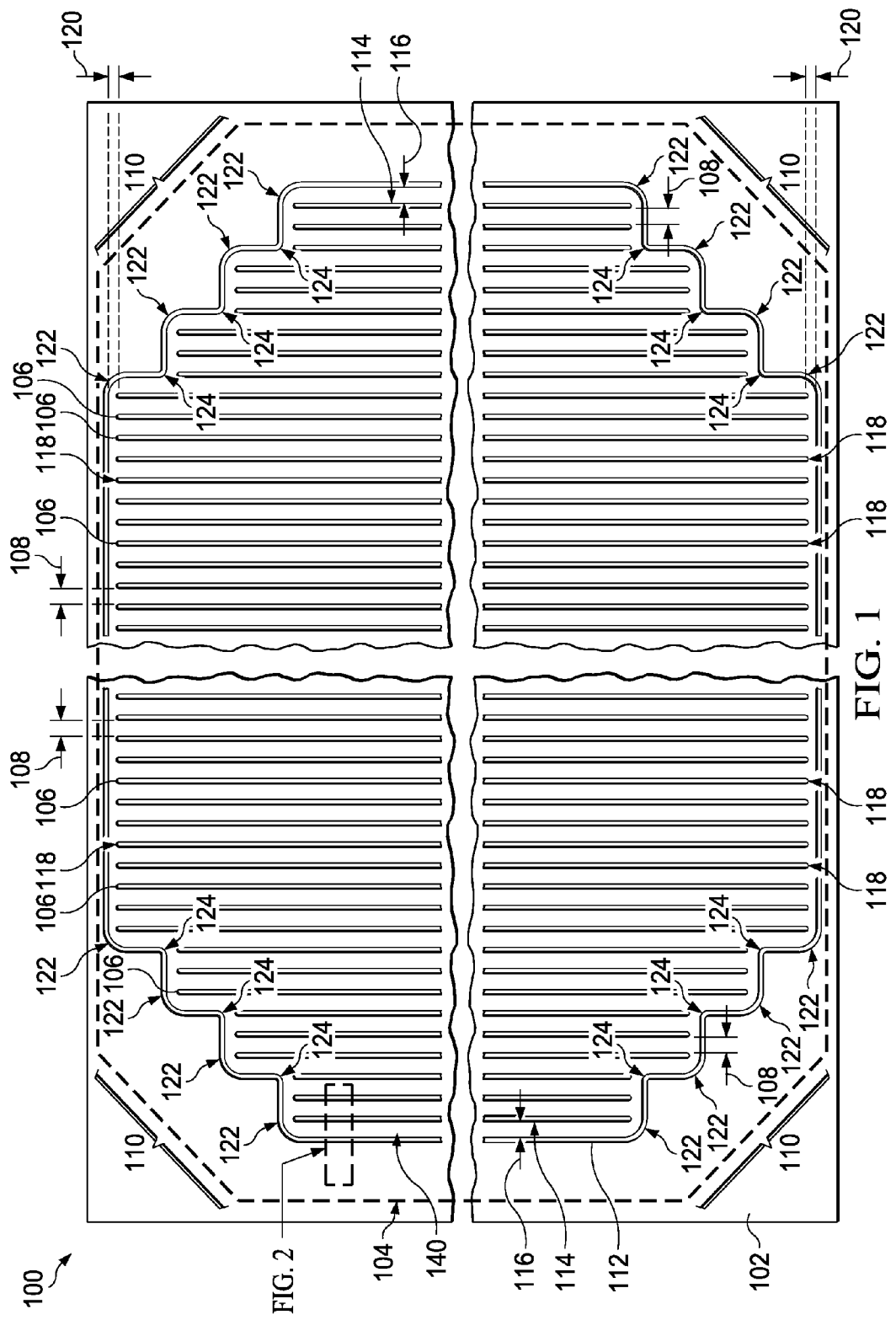
FIG. 1 is a top view of an example semiconductor device including a vertical MOS transistor with drain trenches, surrounded by a termination trench.

FIG. 1 is a top view of an example semiconductor device including a vertical MOS transistor with drain trenches, surrounded by a termination trench. The semiconductor device 100 is formed on a substrate 102 which includes semiconductor material, such as a silicon wafer. The vertical MOS transistor 104 includes a plurality of drain trenches 106 in a vertical drain drift region of the substrate 102. Each drain trench 106 is at least 3 microns deep in the substrate 102 and includes a dielectric liner contacting the substrate 102 and a field plate inside the dielectric liner. The vertical MOS transistor 104 includes a drain contact region in the substrate 102 below the drain trenches 106. The vertical MOS transistor 104 includes a gate and a source electrode over the substrate 102; the gate and source electrode, as well as dielectric layers over the substrate, are not shown in FIG. 1 to more clearly show the configuration of the drain trenches 106. The drain trenches 106 are arranged parallel to each other on a substantially constant pitch, so that adjacent drain trenches 106 are separated by a substantially constant spacing 108 of the substrate 102 across the vertical MOS transistor 104. The spacing 108 is less than 5 microns and may be 1 micron to 3 microns. A width of the drain trenches 106 may be, for example, 700 nanometers to 2 microns.

The vertical MOS transistor 104 has at least one chamfered corner 110, and possibly four chamfered corners 110 as shown in FIG. 1. Each chamfered corner 110 extends across at least five drain trenches 106, that is, there are at least five drain trenches 106 at each chamfered corner 110 which are shorter than the drain trenches 106 located away from the chamfered corners 110. At each chamfered corner 110, there are at least two drain trenches 106 which are recessed from immediately adjacent drain trenches 106, that is, there are at least two drain trenches 106 which do not extend as far as immediately adjacent drain trenches 106. Chamfered corners which extend across less than five drain trenches 106 do not provide adequate stress relief, leading to undesired performance degradation of the vertical MOS transistor 104.

The drain trenches 106 are surrounded by a termination trench 112. The termination trench 112 is at least 3 microns deep in the substrate 102 and includes a dielectric liner contacting the substrate 102 and a field plate inside the dielectric liner. The drain contact region extends under the termination trench 112. The termination trench 112 is separated from outer instances 114 of the drain trenches 106 by a side space which is 80 percent to 120 percent of the substantially constant spacing 108 between the drain trenches 106. The termination trench 112 is separated from ends 118 of instances of the drain trenches, located away from the chamfered corners, by an end space 120 of 50 percent to 90 percent of the substantially constant spacing 108 between the drain trenches 106.

At each chamfered corner 110, the termination trench 112 includes at least three external corners 122 which extend around an end of a drain trench 106 which extends past an adjacent drain trench 106. At each chamfered corner 110, the termination trench 112 also includes at least two internal corners 124 which extend past an end of a drain trench 106 which is recessed from an adjacent drain trench 106. At the chamfered corners, the external corners 122 and internal corners 124 alternate in series.

At each external corner 122, every point on the interior edge 140 of the termination trench 112 is separated from the adjacent drain trench 106 by 50 percent to 120 percent of the substantially constant spacing 108 between the drain trenches 106. Forming the termination trench 112 at each external corner 122 as described may advantageously reduce premature breakdown of the vertical MOS transistor 104.

At each internal corner 124, every point on the interior edge 140 of the termination trench 112 is separated from sides and ends of the adjacent drain trenches 106 by 50 percent to 120 percent of the substantially constant spacing 108 between the drain trenches 106. A radius of the interior edge of the termination trench 112 at each internal corner 124 is 25 percent to 75 percent of the substantially constant spacing 108 between the drain trenches 106. For example, if the spacing 108 between the drain trenches 106 is 2.4 microns, the radius of the interior edge of the termination trench 112 at each internal corner 124 is 0.6 microns to 1.8 microns. Forming the termination trench 112 at each internal corner 124 as described may advantageously reduce premature breakdown and reduce breakdown instability of the vertical MOS transistor 104.

Figure 2:
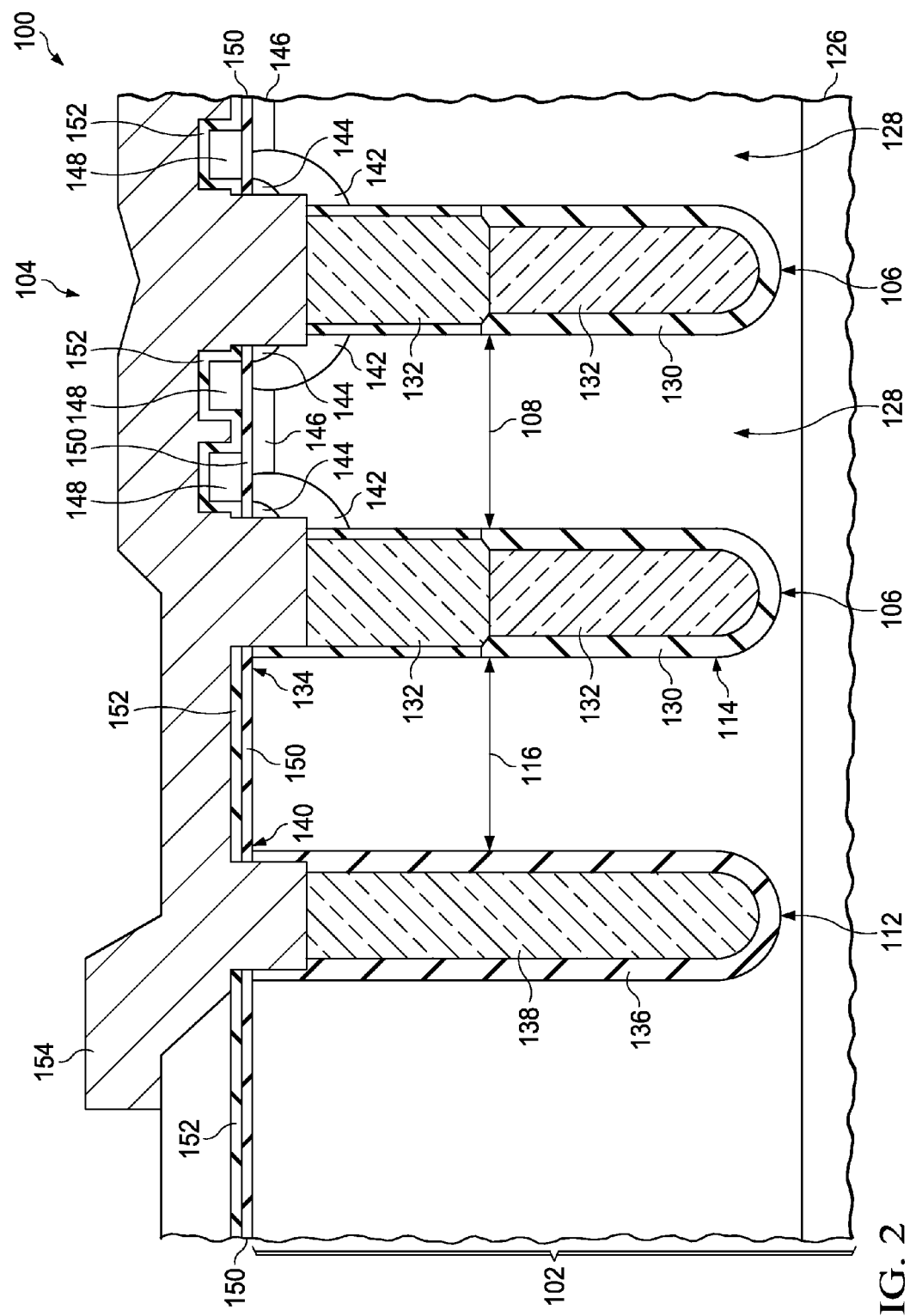
FIG. 2 is a cross section of the semiconductor device of FIG. 1, through the termination trench and two adjacent drain trenches.

FIG. 2 is a cross section of the semiconductor device of FIG. 1, through the termination trench and two adjacent drain trenches, at the location designated in FIG. 1. The drain contact region 126 is a heavily doped region. For example, the drain contact region 126 may have a doping density of $1 \times 10^{18}$ cm$^{-3}$ to $1 \times 10^{21}$ cm$^{-3}$. The vertical drain drift region 128 is formed in the substrate 102 over the drain contact region 126. The drain trenches 106 and the termination trench 112 are formed in the substrate 102. The drain trenches 106 have dielectric liners 130 which contact the substrate 102 and field plates 132 inside the dielectric liners 130. The field plates 132 may be segmented, as depicted in FIG. 2, wherein the dielectric liner 130 is thinner proximate to a top surface 134 of the substrate 102 and thicker proximate to the drain contact region 126. The drain trenches 106 are separated by the substantially constant spacing 108 from each other. The termination trench 112 is separated from the outer instance 114 of the drain trenches 106 by the side space 116. The termination trench 112 has a dielectric liner 136 which contacts the substrate 102 and a field plate 138 inside the dielectric liner 136. The dielectric liner 136 of the termination trench 112 is substantially uniform in thickness along the field plate 138. The termination trench 112 may be substantially as deep in the substrate 102 as the drain trenches 106. A portion, or all, of the termination trench 112 may be formed concurrently with the drain trenches 106. The termination trench 112 and the drain trenches 106 extend proximate to, or into, the drain contact region 126. The drain contact region 126 extends under, and possibly past, the termination trench 112. A vertical thickness and average doping density of the vertical drain drift region 128 may depend on an operating voltage of the vertical MOS transistor 104. For example, a vertical MOS transistor 104 designed to operate at 30 volts may have a vertical drain drift region 128 that is 4 microns thick with an average doping density of $5 \times 10^{16}$ cm$^{-3}$ to $1 \times 10^{17}$ cm$^{-3}$. A vertical MOS transistor 104 designed to operate at 100 volts may have a vertical drain drift region 128 that is 10 microns thick with an average doping density of $1 \times 10^{16}$ cm$^{-3}$ to $5 \times 10^{16}$ cm$^{-3}$. The interior edge 140 of the termination trench 112 faces the drain trenches 106 at the top surface 134 of the substrate 102.

The vertical MOS transistor 104 includes a body 142 in the substrate 102 over the vertical drain drift region 128 extending to the top surface 134 of the substrate 102. The vertical MOS transistor 104 also includes a source 144 in the substrate 102 extending to the top surface 134, separated from the vertical drain drift region 128 by the body 142. A lightly doped drain extension 146 of the vertical MOS transistor 104 is located in the substrate 102 over the vertical drain drift region 128 abutting the body 142. A gate 148 of the vertical MOS transistor 104, for example a split gate 148 as depicted in FIG. 2, is located above the body 142 over a gate dielectric layer 150. Other gate configurations, such as a trench gate or a contiguous planar gate, are within the scope of the instant example. A dielectric cap layer 152 may be disposed over the top surface 134 of the substrate 102 and the split gate 148. A source electrode 154 is disposed over the substrate 102, making electrical connections to the source 144 and the body 142, and possibly the field plates 132 in the drain trenches 106, and possibly to the field plate 138 in the termination trench 112.

Figure 3:
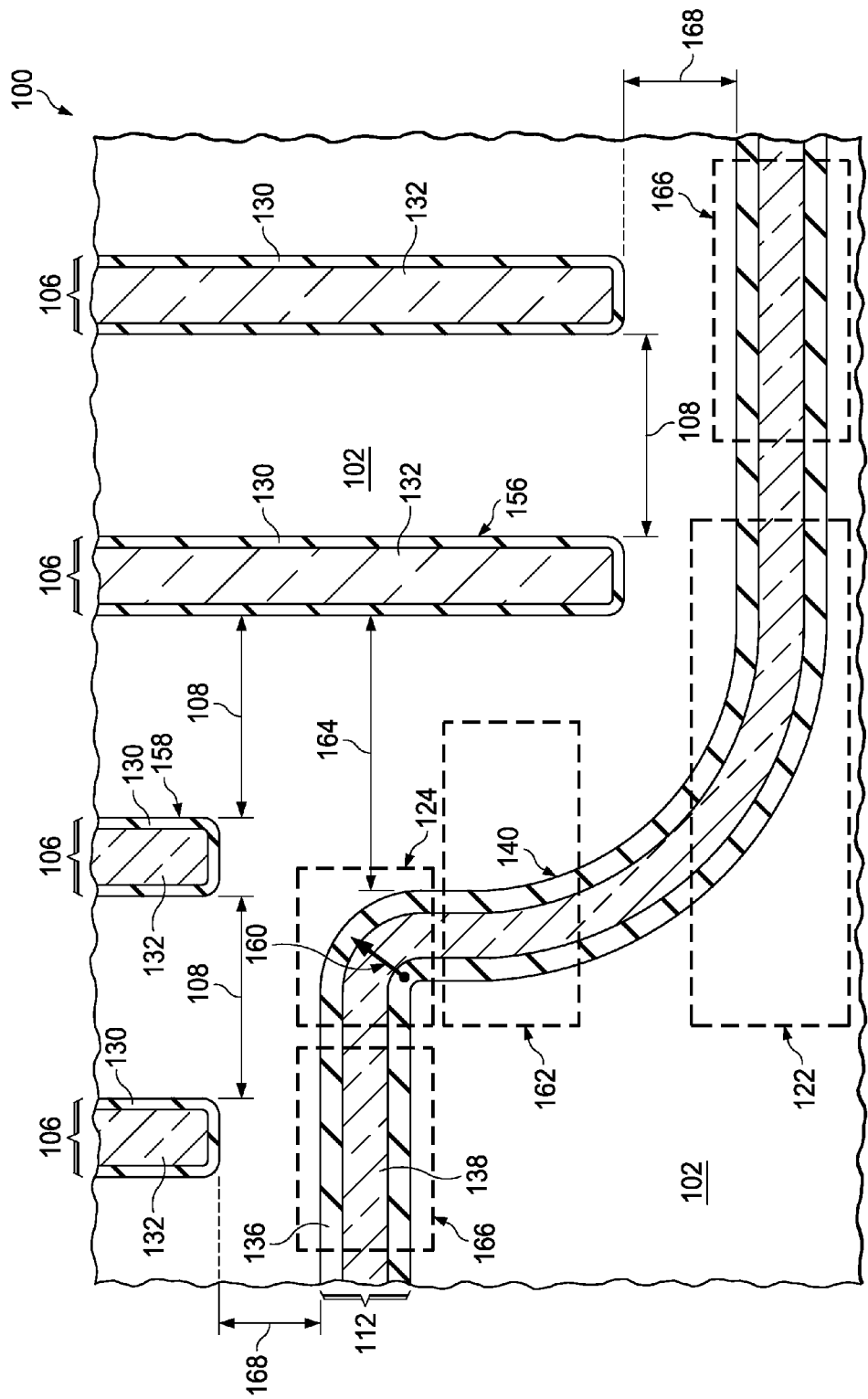
FIG. 3 is a top view of the semiconductor device of FIG. 1, showing an external corner and an internal corner of the termination trench in more detail.

FIG. 3 is a top view of the semiconductor device of FIG. 1, showing an external corner and an internal corner of the termination trench in more detail. The gate dielectric layer 150, the split gate 148, the dielectric cap layer 152 and the source electrode 154 of FIG. 2 are removed in FIG. 3 to more clearly show the configuration of the drain trenches 106 and the termination trench 112. The drain trenches 106 include the dielectric liners 130 and the field plates 132. The drain trenches 106 are separated by the substantially constant spacing 108. The termination trench includes the dielectric liner 136 and the field plate 138.

The external corner 122 extends around one instance 156 of the drain trenches 106 which extends past an adjacent instance 158 of the drain trenches 106 which is recessed from the one instance 156. At the external corner 122, every point on the interior edge 140 of the termination trench 112 is separated from the one instance 156 of the drain trenches 106 by 50 percent to 120 percent of the substantially constant spacing 108 between the drain trenches 106.

The internal corner 124 extends past the adjacent instance 158 of the drain trenches 106 which is recessed from the one instance 156 of the drain trenches 106. At each internal corner 124, every point on the interior edge 140 of the termination trench 112 is separated from the one instance 156 of the drain trenches 106 and the adjacent instance 158 of the drain trenches 106 by 50 percent to 120 percent of the substantially constant spacing 108 between the drain trenches 106. A radius 160 of the interior edge 140 of the termination trench 112 at the internal corner 124 is 25 percent to 75 percent of the substantially constant spacing 108 between the drain trenches 106.

The termination trench 112 may include one or more parallel straight segments 162 between the external corner 122 and internal corner 124; the parallel straight segments 162 are parallel to the drain trenches 106. The parallel straight segments 162 are separated from adjacent drain trenches 106 by a parallel space 164 which is 80 percent to 120 percent of the substantially constant spacing 108 between the drain trenches 106 of FIG. 1. The termination trench 112 may include one or more perpendicular straight segments 166 between the external corner 122 and internal corner 124; the perpendicular straight segments 166 are perpendicular to the drain trenches 106. The perpendicular straight segments 166 are separated from ends of adjacent drain trenches 106 by a perpendicular space 168 which is 50 percent to 90 percent of the substantially constant spacing 108 between the drain trenches 106 of FIG. 1.

Figure 4A:
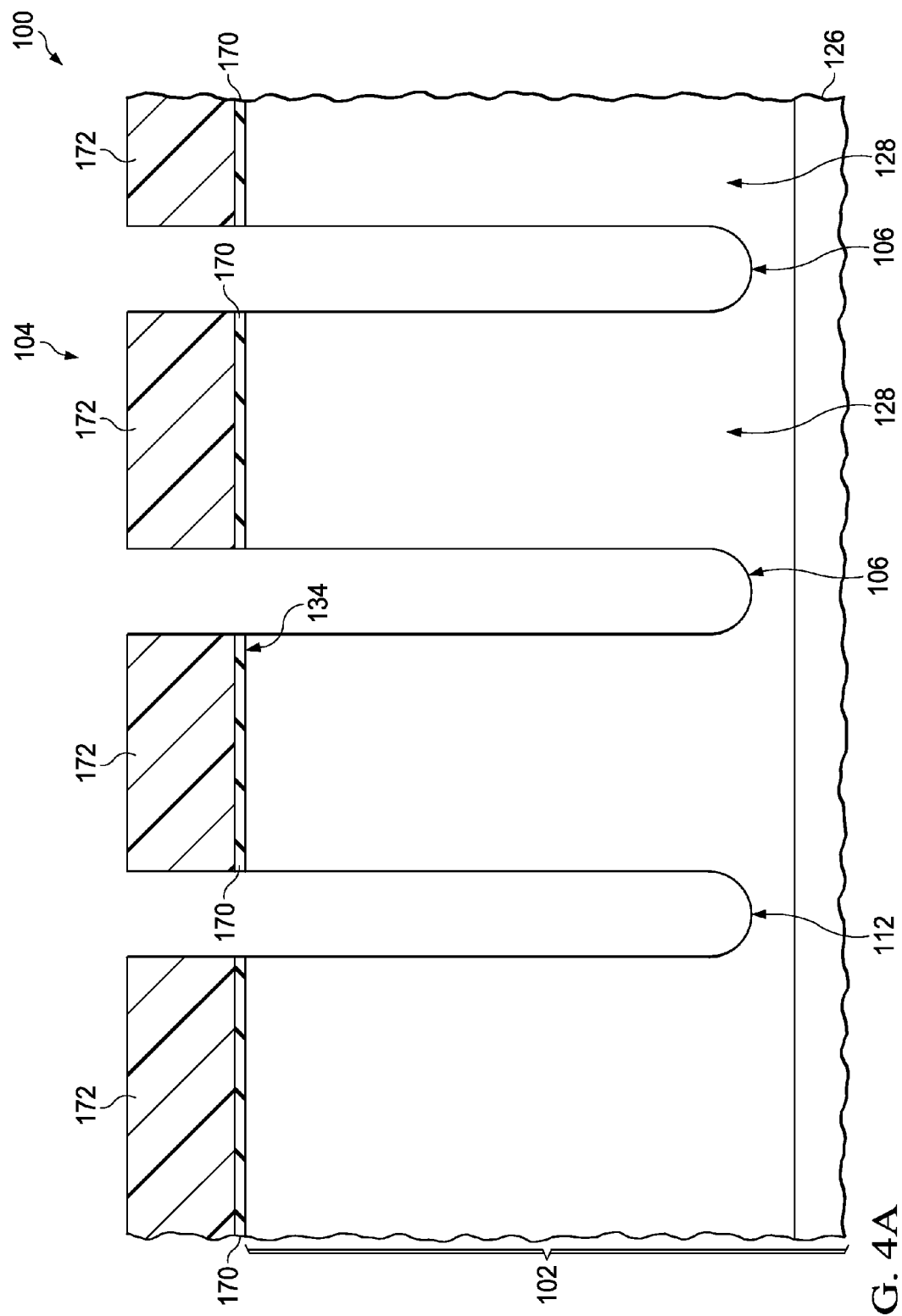
FIG. 4A through FIG. 4G are cross sections of the semiconductor device of FIG. 1, through the termination trench and two adjacent drain trenches, at the same location as FIG. 2, depicted in successive stages of fabrication.

FIG. 4A through FIG. 4G are cross sections of the semiconductor device of FIG. 1, through the termination trench and two adjacent drain trenches, at the same location as FIG. 2, depicted in successive stages of fabrication. Referring to FIG. 4A, the drain contact region 126 of the semiconductor device 100 is formed in the substrate 102 as a heavily doped region. The vertical drain drift region 128 is formed in the substrate 102 over the drain contact region 126. The drain contact region 126 may be a buried layer and a portion of the substrate 102 over the drain contact region 126 containing the vertical drain drift region 128 may be formed by an epitaxial process.

A pad oxide layer 170 is formed over the top surface 134 of the substrate 102, for example by thermal oxidation. The pad oxide layer 170 may be 10 nanometers to 50 nanometers thick. A trench mask 172 is formed over the pad oxide layer 170; the trench mask 172 exposes areas for the drain trenches 106 and the termination trench 112. The trench mask 172 may include photoresist formed by a photolithographic process and/or may include hard mask material such as silicon nitride and/or amorphous carbon. A trench etch process removes the pad oxide layer 170 and semiconductor material from the substrate 102 in the areas exposed by the trench mask 172. The trench etch process may be a continuous phase reactive ion etch (RIE) process which concurrently removes the semiconductor material from bottoms of etched regions for the drain trenches 106 and the termination trench 112 while passivating sidewalls of the etched regions. Alternatively, the trench etch process may be an alternating phase RIE process which removes the semiconductor material from bottoms of the etched regions for the drain trenches 106 and the termination trench 112 in a first phase and passivates the sidewalls of the etched regions in a second phase. The trench mask 172 is removed after the trench etch process is completed, by ashing and/or a wet clean process. The pad oxide layer 170 may optionally be removed, using a buffered dilute aqueous solution of hydrofluoric acid.

Figure 4B:
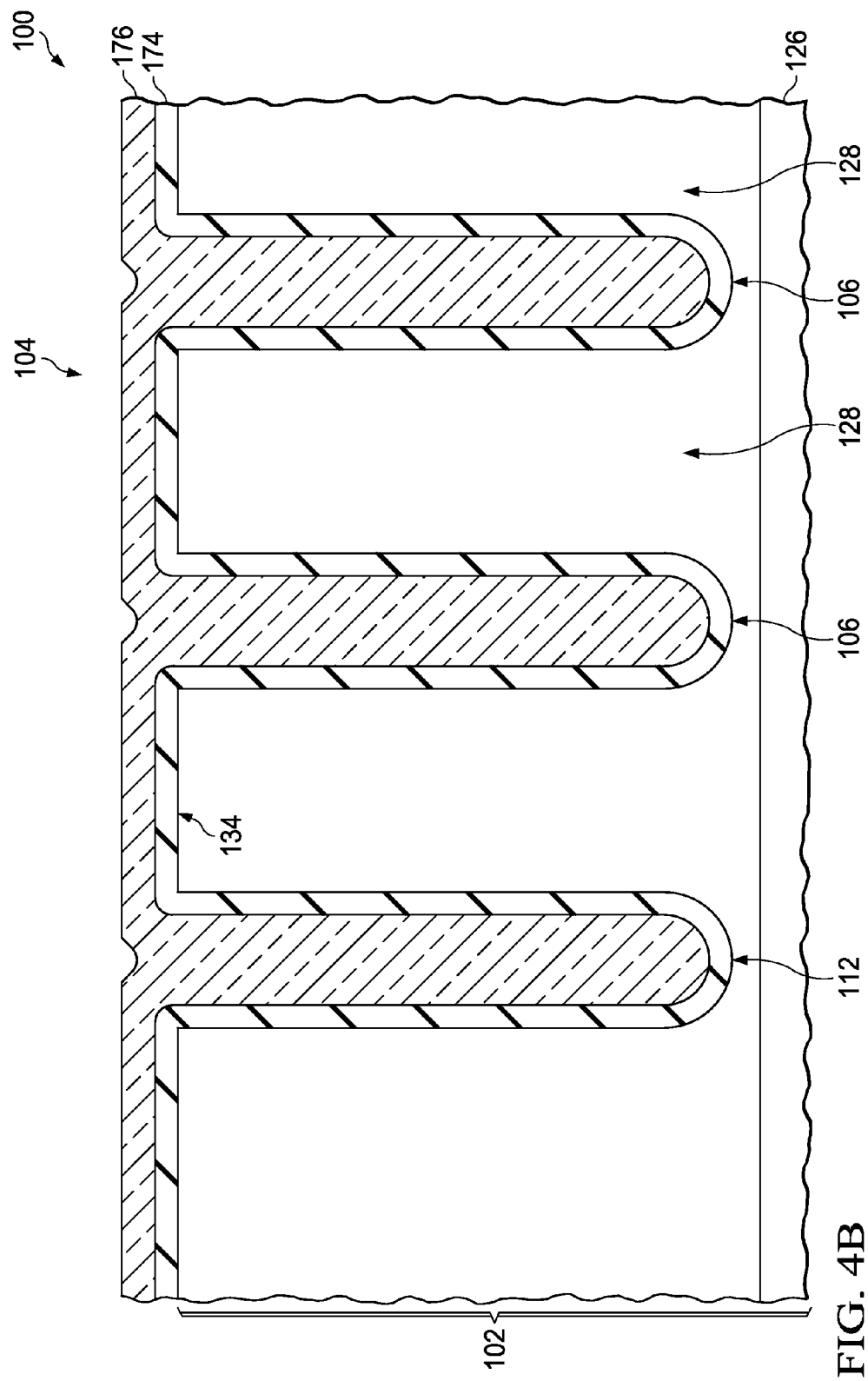

Referring to FIG. 4B, a first layer of silicon dioxide 174 is formed over the top surface 134 of the substrate 102 and in the etched regions for the drain trenches 106 and the termination trench 112. The first layer of silicon dioxide 174 is formed by thermal oxidation. A thickness of the first layer of silicon dioxide 174 depends on an operating voltage of the vertical MOS transistor 104. For example, in a vertical MOS transistor 104 designed to operate at 30 volts, the first layer of silicon dioxide 174 may be 170 nanometers to 220 nanometers thick. In a vertical MOS transistor 104 designed to operate at 100 volts, the first layer of silicon dioxide 174 may be 400 nanometers to 500 nanometers thick.

A first layer of field plate material 176 such as polysilicon is formed over the first layer of silicon dioxide 174, extending into the etched regions for the drain trenches 106 and the termination trench 112. Polysilicon in the first layer of field plate material 176 may be formed by decomposition of silane ($SiH_4$) at a temperature of 575° C. to 650° C. and a pressure of 350 millitorr to 400 millitorr. Polysilicon in the first layer of field plate material 176 may be doped during formation by adding phosphine ($PH_3$) to the silane.

Figure 4C:
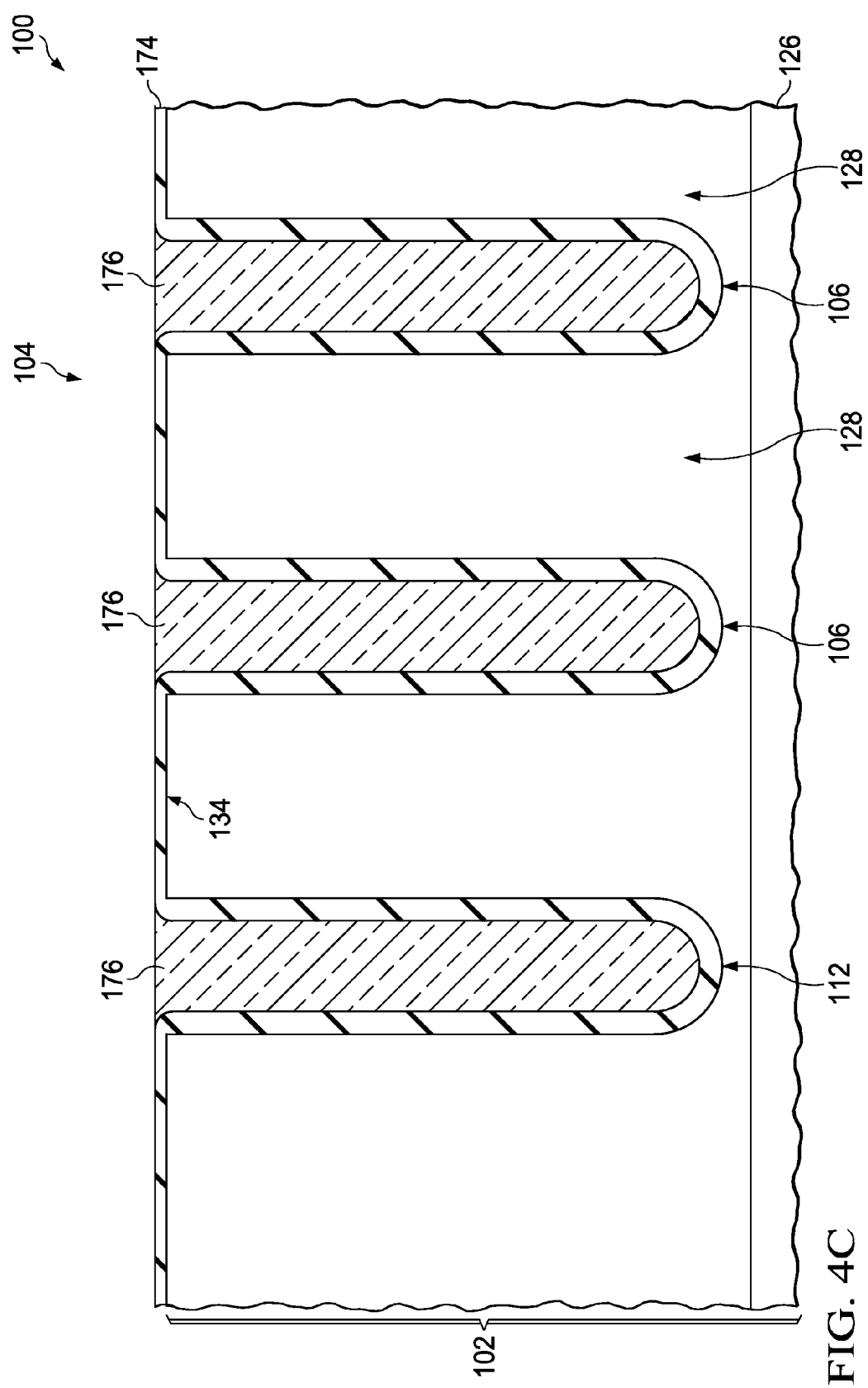

Referring to FIG. 4C, the field plate material 176 is removed from over the top surface 134 of the substrate 102. The field plate material 176 may removed by an etchback process and/or a chemical mechanical polish (CMP) process. The field plate material 176 is left in the drain trenches 106 and the termination trench 112.

Figure 4D:
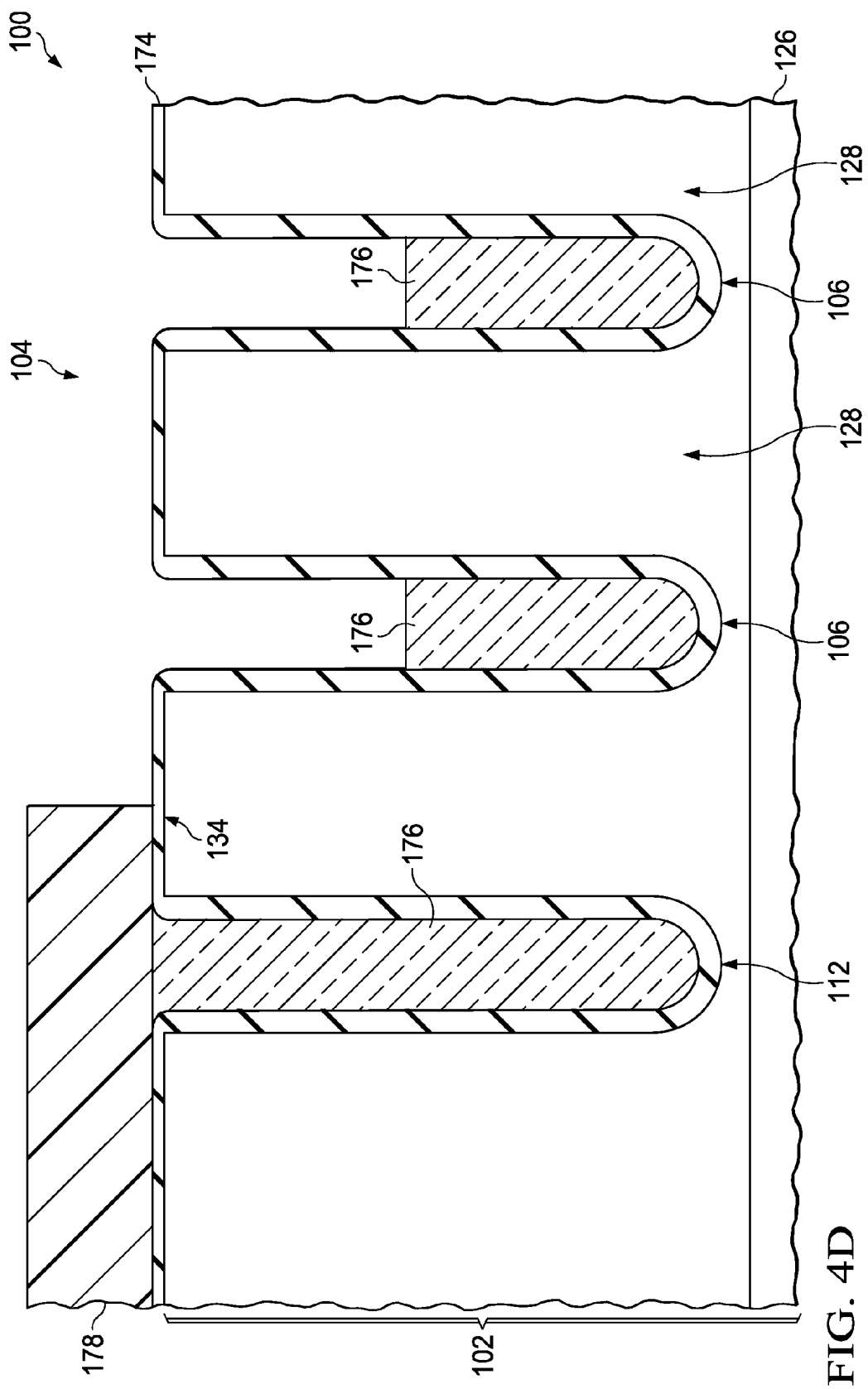

Referring to FIG. 4D, a field plate mask 178 is formed over the top surface 134 of the substrate 102 so as to expose the field plate material 176 in the drain trenches 106 and cover the field plate material 176 in the termination trench 112. The field plate mask 178 may include photoresist and/or hard mask material. An etch process removes a portion of the field plate material 176 in the drain trenches 106, leaving the field plate material 176 in bottom portions of the drain trenches 106. The etch process may possibly be selective to the first layer of silicon dioxide 174, so that a majority of the first layer of silicon dioxide 174 remains in upper portions of the drain trenches 106 as depicted in FIG. 4D. Alternatively, the etch process may possibly remove a majority, or substantially all, of the first layer of silicon dioxide 174 in the upper portions of the drain trenches 106. The etch process may be a timed wet etch using an aqueous solution of tetramethyl ammonium hydroxide or choline. Alternatively, the etch process may be a reactive ion etch process using bromine radicals.

Figure 4E:
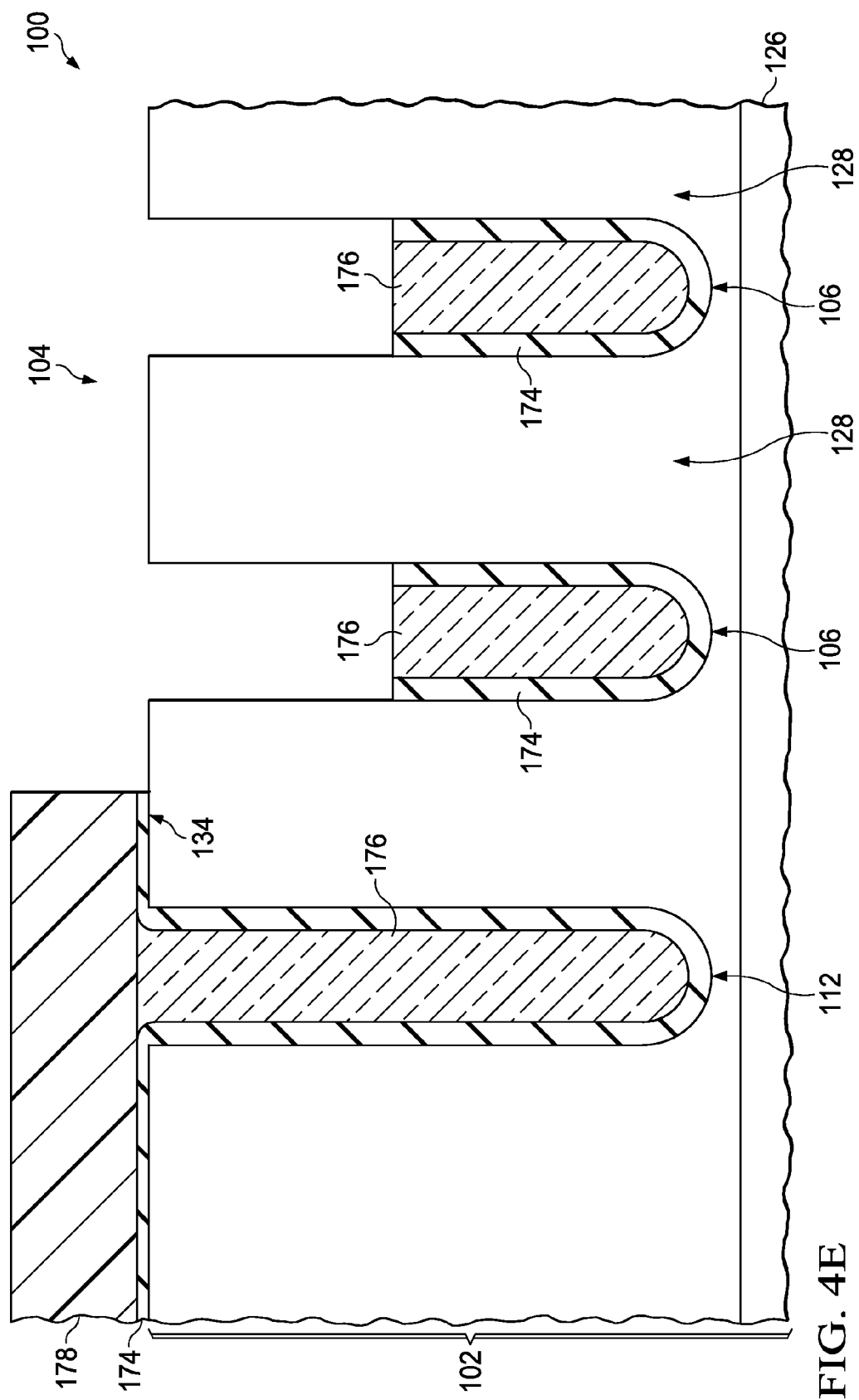

Referring to FIG. 4E, remaining silicon dioxide of the first layer of silicon dioxide 174 in the upper portions of the drain trenches 106 is removed. The silicon dioxide in the first layer of silicon dioxide 174 in the bottom portions of the drain trenches 106 is not removed. The remaining silicon dioxide of the first layer of silicon dioxide 174 in the upper portions of the drain trenches 106 may be removed using a timed wet etch with a buffered dilute aqueous solution of hydrofluoric acid. The field plate mask 178 is removed after the remaining silicon dioxide of the first layer of silicon dioxide 174 in the upper portions of the drain trenches 106 is removed.

Figure 4F:
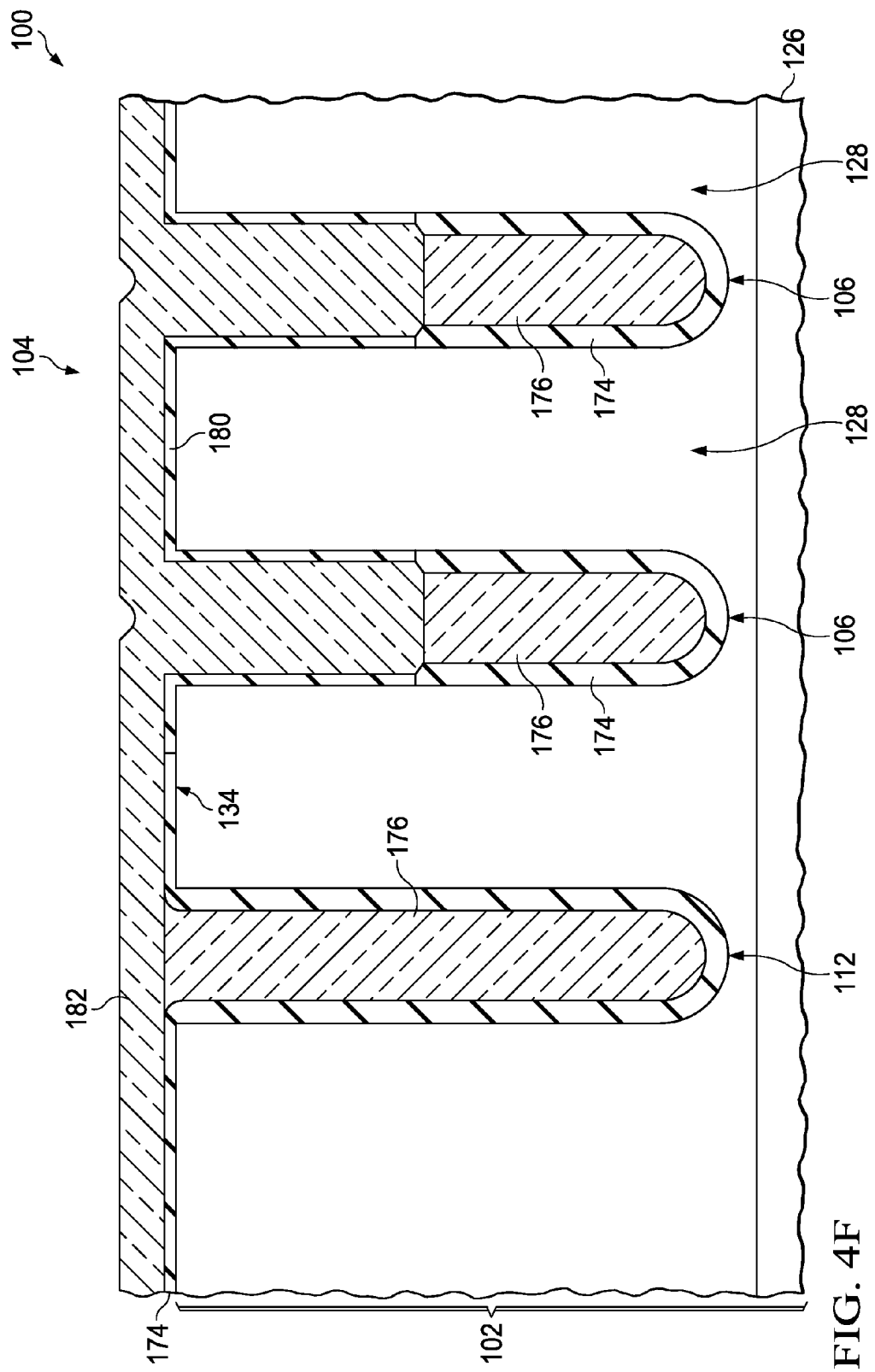

Referring to FIG. 4F, a second layer of silicon dioxide 180 is formed on sidewalls of the drain trenches 106 above the first layer of silicon dioxide 174 to form a continuous dielectric liner in the drain trenches 106. The second layer of silicon dioxide 180 extends onto exposed silicon at the top surface 134 of the substrate 102. The second layer of silicon dioxide 180 may be formed by thermal oxidation. A thickness of the second layer of silicon dioxide 180 depends on an operating voltage of the vertical MOS transistor 104. For example, in a vertical MOS transistor 104 designed to operate at 30 volts, the second layer of silicon dioxide 180 may be 55 nanometers to 65 nanometers thick. In a vertical MOS transistor 104 designed to operate at 100 volts, the first layer of silicon dioxide 174 may be 150 nanometers to 200 nanometers thick.

A second layer of field plate material 182 is formed over the second layer of silicon dioxide 180, extending into the drain trenches 106. The second layer of field plate material 182 may be the same material as the first layer of field plate material 176, and may be formed by a similar process. The second layer of field plate material 182 may possibly make electrical connection to the first layer of field plate material 176, or may be separated from the first layer of field plate material 176 by a portion of the second layer of silicon dioxide 180 formed on the first layer of field plate material 176.

Figure 4G:
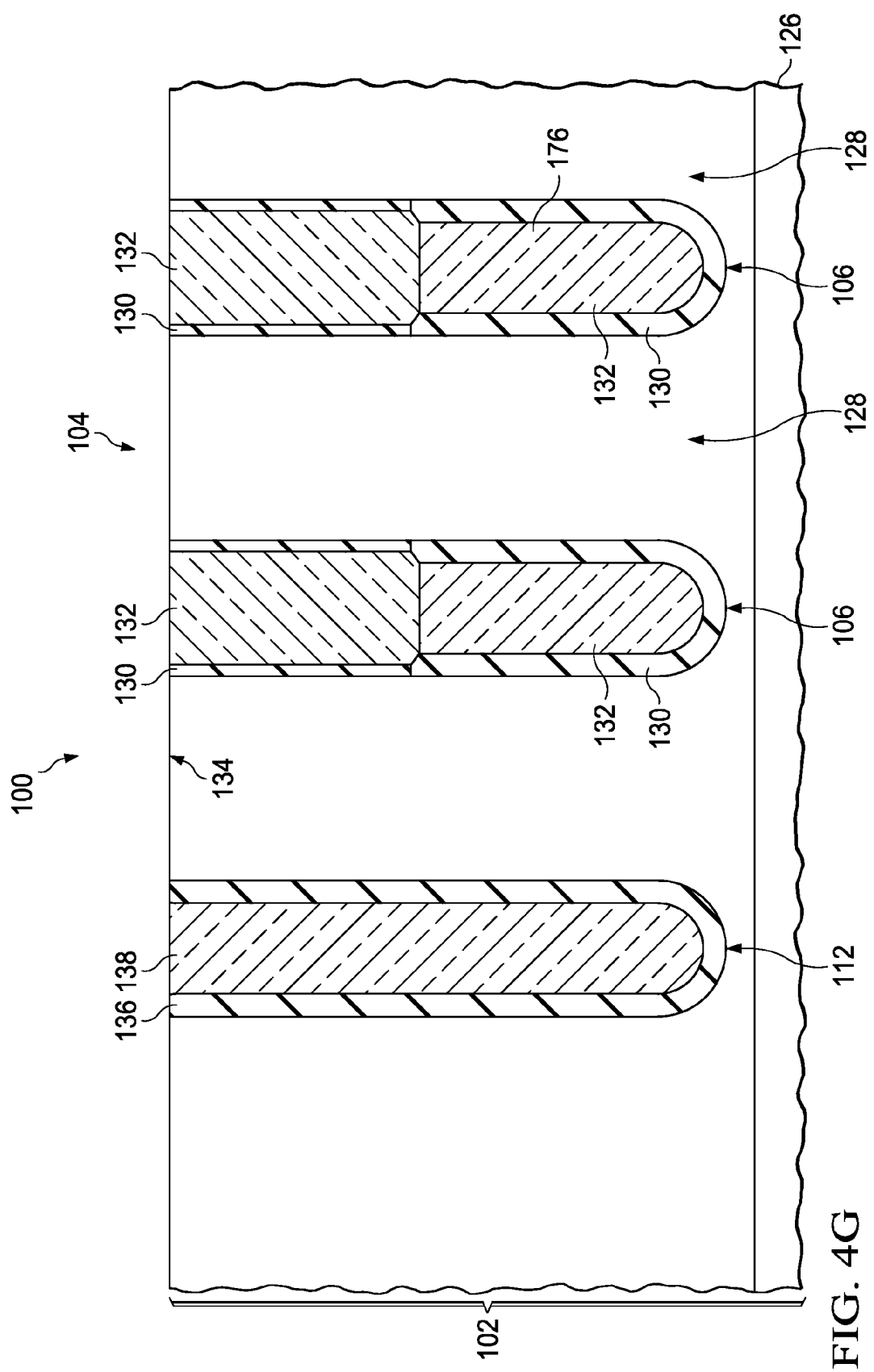

Referring to FIG. 4G, the second layer of field plate material 182 of FIG. 4F is removed from over the top surface 134 of the substrate 102, leaving the second layer of field plate material 182 in the upper portion of the drain trenches 106 and the first layer of field plate material 176 of FIG. 4F in the lower portions of the drain trenches 106 to provide the field plates 132. The first layer of field plate material 176 in the termination trench 112 provides the field plate 138. The first layer of silicon dioxide 174 of FIG. 4F in the bottom portions of the drain trenches 106 and the second layer of silicon dioxide 180 in the upper portions of the drain trenches 106 provide the dielectric liners 130. The first layer of silicon dioxide 174 in the termination trench 112 provides the dielectric liner 136. A portion or all of the first layer of silicon dioxide 174 and the second layer of silicon dioxide 180 may be removed from over the top surface 134 of the substrate 102 when the second layer of field plate material 182 is removed.

Forming the drain trenches 106 to have thinner dielectric liners 130 in upper portions and thicker dielectric liners 130 in lower portions while maintaining the thicker dielectric liner 136 in the termination trench 112 may advantageously provide a shorter vertical drain drift region 128 for a given operating voltage of the vertical MOS transistor 104 while providing desired breakdown voltage and breakdown stability at the termination trench 112. Fabrication of the semiconductor device continues with formation of the gate dielectric layer, gate, and so on, to provide the semiconductor device 100 of FIG. 1 and FIG. 2.

Figure 5:
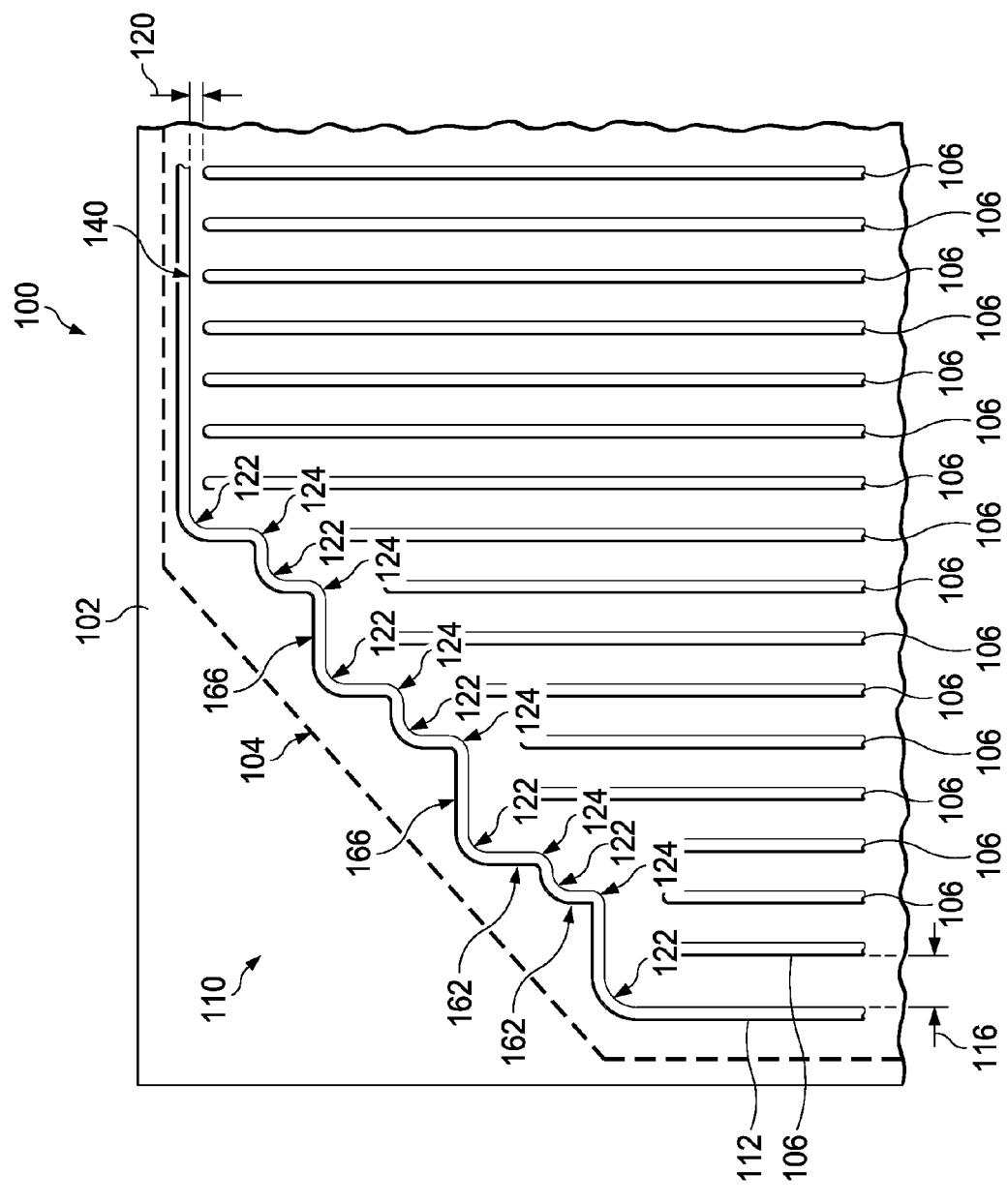
FIG. 5 through FIG. 7 are top views of alternative configurations of chamfered corners of the semiconductor device of FIG. 1.
Figure 6:
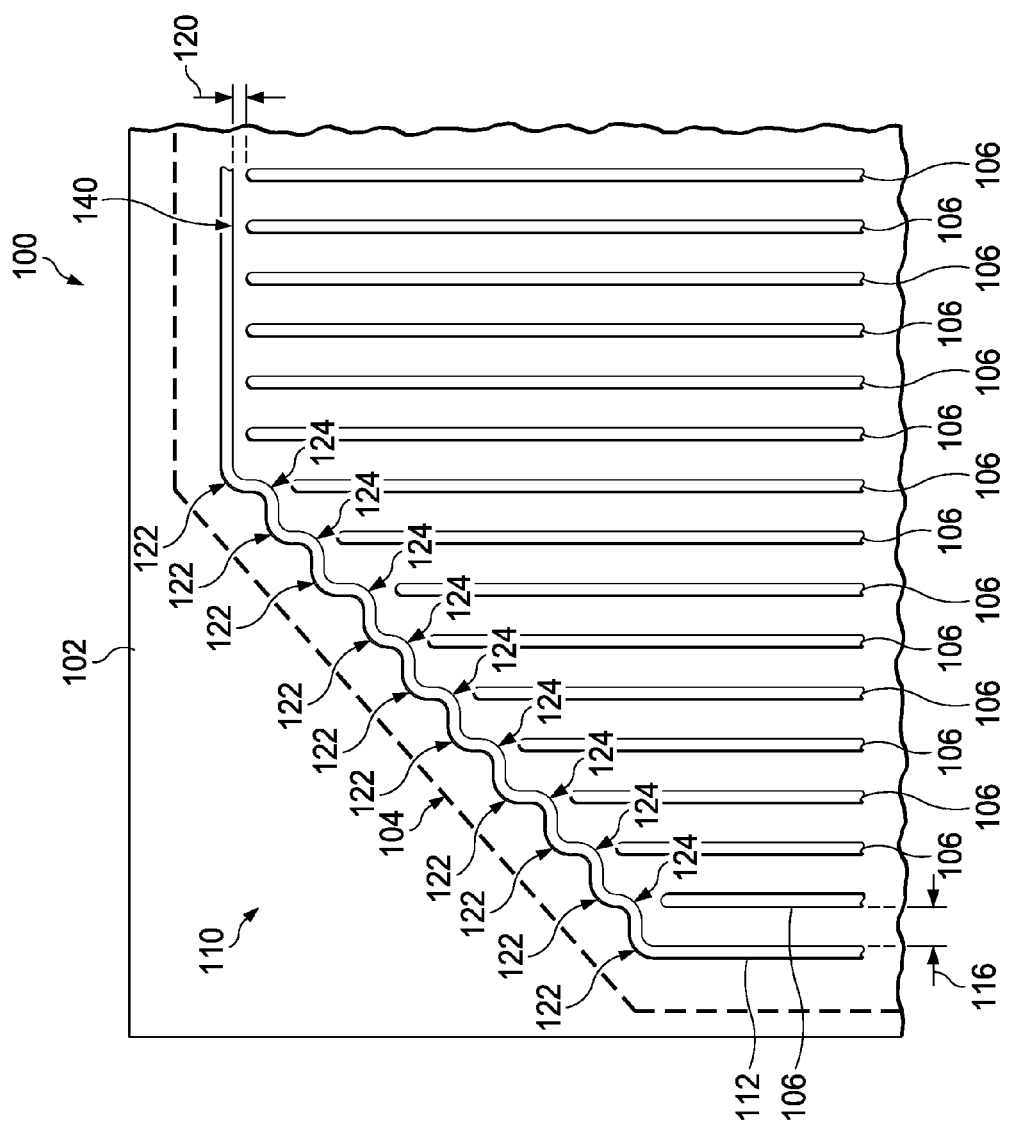
Figure 7:
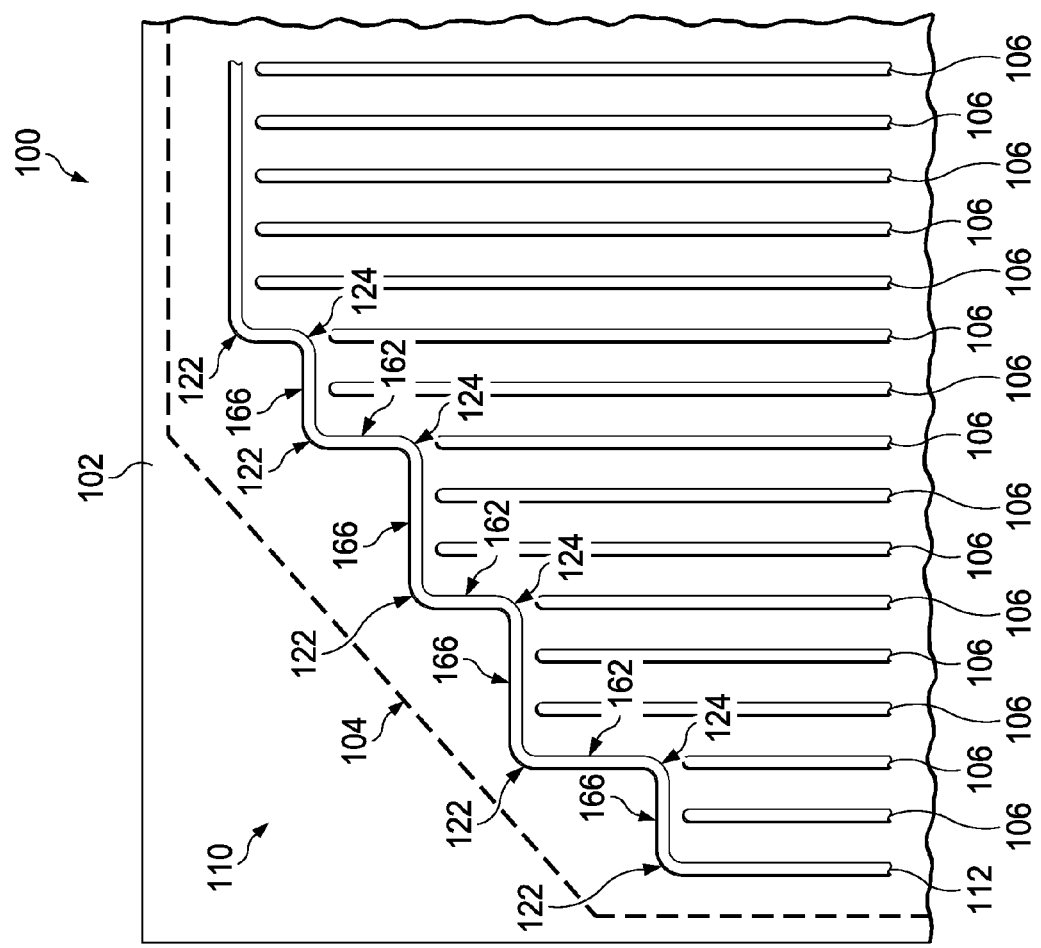

FIG. 5 through FIG. 7 are top views of alternative configurations of chamfered corners of the semiconductor device of FIG. 1. Referring to FIG. 5, the chamfered corner 110 spans a plurality of the drain trenches 106 with varying lengths. The termination trench 112 at the chamfered corner 110 includes alternating instances of the external corners 122 and the internal corners 124. Some adjacent instances of the external corners 122 and the internal corners 124 are connected by instances of the parallel straight segments 162 and other adjacent instances of the external corners 122 and the internal corners 124 are connected by instances of the perpendicular straight segments 166. Still other adjacent instances of the external corners 122 and the internal corners 124 contact each other without intervening instances of the parallel straight segments 162 or the perpendicular straight segments 166. At the chamfered corner 110 every point on the interior edge 140 of the termination trench 112 is separated from adjacent instances of the drain trenches 106 by 50 percent to 120 percent of the substantially constant spacing 108 between the drain trenches 106, as described in reference to FIG. 3.

Referring to FIG. 6, the chamfered corner 110 spans a plurality of the drain trenches 106 all having different lengths. The termination trench 112 at the chamfered corner 110 includes alternating instances of the external corners 122 and the internal corners 124, without intervening instances of the parallel straight segments 162 or the perpendicular straight segments 166 of FIG. 3. At the chamfered corner 110 every point on the interior edge 140 of the termination trench 112 is separated from adjacent instances of the drain trenches 106 by 50 percent to 120 percent of the substantially constant spacing 108 between the drain trenches 106, as described in reference to FIG. 3.

Referring to FIG. 7, the chamfered corner 110 spans a plurality of the drain trenches 106 each being adjacent to a drain trench 106 with a same length. The termination trench 112 at the chamfered corner 110 includes alternating instances of the external corners 122 and the internal corners 124, with intervening instances of the parallel straight segments 162 or the perpendicular straight segments 166 between each adjacent pair of the external corners 122 and the internal corners 124. At the chamfered corner 110 every point on the interior edge 140 of the termination trench 112 is separated from adjacent instances of the drain trenches 106 by 50 percent to 120 percent of the substantially constant spacing 108 between the drain trenches 106, as described in reference to FIG. 3.

Figure 8:
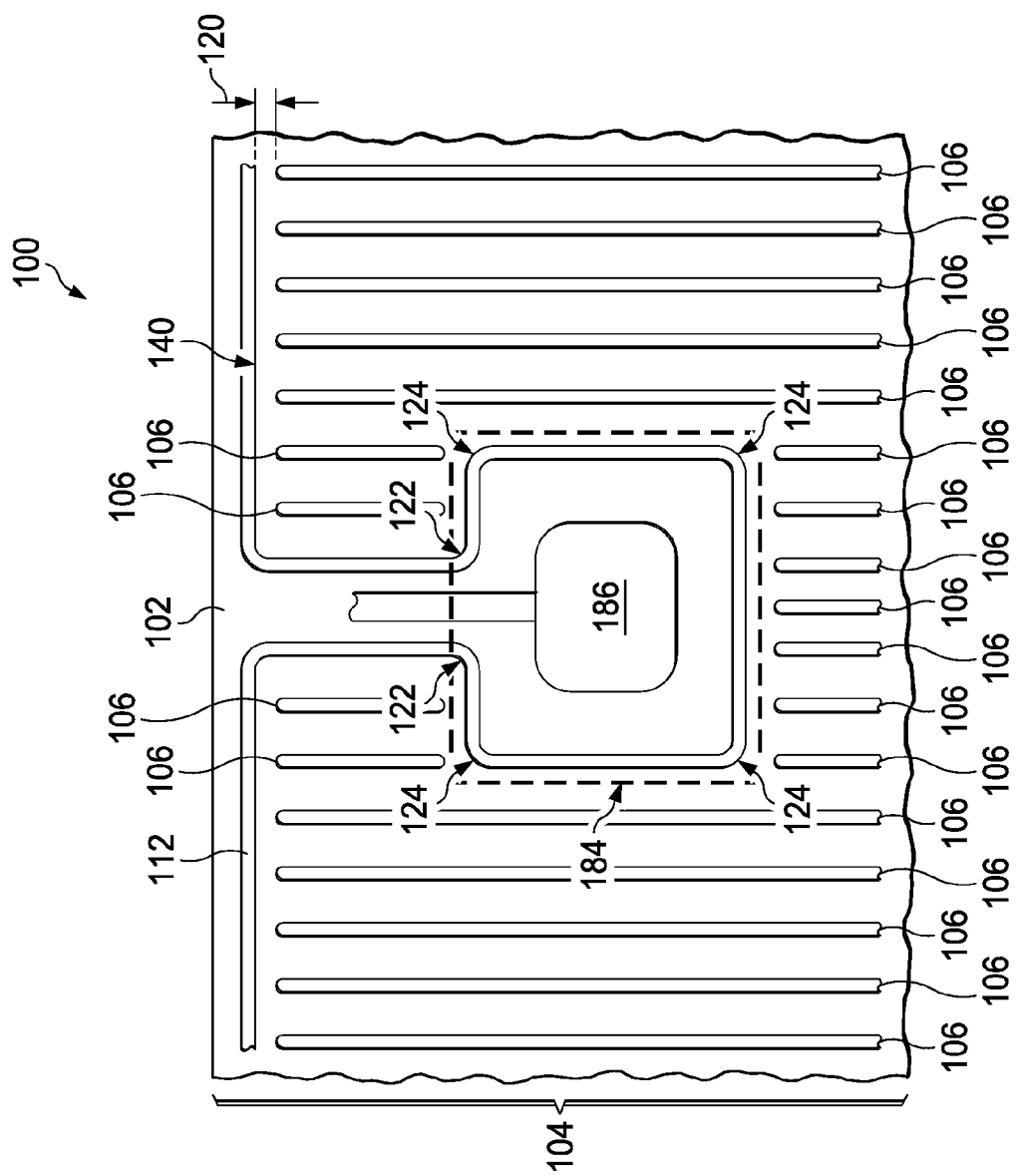
FIG. 8 is a top view of the semiconductor device of FIG. 1, depicting an optional isolated interior region.

FIG. 8 is a top view of the semiconductor device of FIG. 1, depicting an optional isolated interior region. The drain trenches 106 are configured in parallel on a substantially constant pitch in the vertical MOS transistor 104. The semiconductor device 100 includes the isolated interior region 184 with the drain trenches 106 on at least three sides. A component 186 such as a temperature sensor 186 may be disposed in the isolated interior region 184, electrically isolated from the vertical MOS transistor 104. The termination trench 112 is disposed at least partially around the isolated interior region 184, separating the isolated interior region 184 from the drain trenches 106. The termination trench 112 around the isolated interior region 184 includes a plurality of internal corners 124 and possibly one or more external corners 122. The termination trench 112 surrounding the vertical MOS transistor 104 may be continuous with the termination trench 112 around the isolated interior region 184 as depicted in FIG. 8. Alternatively, the termination trench 112 surrounding the vertical MOS transistor 104 may possibly be separate from the termination trench 112 around the isolated interior region 184.

At each internal corner 124 in the termination trench 112 around the isolated interior region 184, every point on the interior edge 140 of the termination trench 112 is separated from the drain trenches 106 by 50 percent to 120 percent of the substantially constant spacing 108 between the drain trenches 106, as described in reference to FIG. 3. A radius 160 of the interior edge 140 of the termination trench 112 at the internal corner 124 is 25 percent to 75 percent of the substantially constant spacing 108 between the drain trenches 106. At each external corner 122, if present, in the termination trench 112 around the isolated interior region 184, every point on the interior edge 140 of the termination trench 112 is separated from the drain trenches 106 by 50 percent to 120 percent of the substantially constant spacing 108 between the drain trenches 106.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A semiconductor device, comprising:
   a substrate comprising a semiconductor;
   a vertical metal oxide semiconductor (MOS) transistor, comprising:
   a drain contact region disposed in the substrate;
   a vertical drain drift region disposed in the substrate over the drain contact region;
   drain trenches disposed in the vertical drift region, wherein the drain trenches are arranged parallel to each other separated by a substantially equal spacing, each of the drain trenches comprising a dielectric liner contacting the substrate and a field plate inside the dielectric liner, the vertical MOS transistor having at least one chamfered corner wherein each chamfered corner extends across at least five of the drain trenches so that the drain trenches at each chamfered corner are shorter than instances of the drain trenches located away from the chamfered corners;
   a body disposed in the substrate above the vertical drain drift region;
   a gate disposed above the body; and
   a source electrode disposed over the substrate; and
   a termination trench disposed in the substrate, the termination trench surrounding the drain trenches, the termination trench comprising a dielectric liner contacting the substrate and a field plate inside the dielectric liner;
   wherein the drain contact region extends under the termination trench, wherein:
   an interior edge of the termination trench is separated from outer instances of the drain trenches by a side space which is 80 percent to 120 percent of the substantially equal spacing between the drain trenches;
   the interior edge of the termination trench is separated from ends of instances of the drain trenches located away from the chamfered corners by an end space which is 50 percent to 90 percent of the spacing between the drain trenches;
   at each chamfered corner, the termination trench includes at least three external corners and at least two internal corners, wherein the external corners and internal corners alternate in series;
   each external corner extends around an end of an instance of the drain trenches which extends past an adjacent instance of the drain trenches, wherein every point on the interior edge of the termination trench is separated from an adjacent instance of the drain trenches by 50 percent to 120 percent of the substantially equal spacing between the drain trenches; and
   each internal corner extends past an end of an instance of the drain trenches which is recessed from an adjacent instance of the drain trenches, wherein every point on the interior edge of the termination trench is separated from sides and ends of the adjacent drain trenches by 50 percent to 120 percent of the substantially equal spacing between the drain trenches.

2. The semiconductor device of claim 1, wherein the termination trench includes a parallel straight segment between an instance of the internal corners and an adjacent instance of the external corners, wherein the parallel straight segment is parallel to the drain trenches.

3. The semiconductor device of claim 1, wherein the termination trench includes a perpendicular straight segment between an instance of the internal corners and an adjacent instance of the external corners, wherein the perpendicular straight segment is perpendicular to the drain trenches.

4. The semiconductor device of claim 1, wherein the substantially equal spacing between the drain trenches is less than 5 microns.

5. The semiconductor device of claim 1, wherein the drain trenches are at least 3 microns deep and the termination trench is at least 3 microns deep.

6. The semiconductor device of claim 1, wherein the dielectric liners in the drain trenches are thicker in bottom portions of the drain trenches and thinner in upper portions of the drain trenches, and wherein the dielectric liner in the termination trench has a substantially uniform thickness.

7. The semiconductor device of claim 1, wherein the dielectric liners in the drain trenches and the dielectric liner in the termination trench are silicon dioxide.

8. The semiconductor device of claim 1, wherein the field plates in the drain trenches and the field plate in the termination trench are polysilicon.

9. The semiconductor device of claim 1, wherein the vertical MOS transistor has four of the chamfered corners.

10. The semiconductor device of claim 1, comprising an isolated interior region with the drain trenches on at least three sides of the isolated interior region, wherein the termination trench is disposed at least partially around the isolated interior region, separating the isolated interior region from the drain trenches.

11. A semiconductor device, comprising:
    a substrate comprising a semiconductor;
    a vertical MOS transistor, comprising:
    a drain contact region disposed in the substrate;
    a vertical drain drift region disposed in the substrate over the drain contact region;
    drain trenches at least 3 microns deep disposed in the vertical drift region, wherein the drain trenches are arranged parallel to each other separated by a substantially equal spacing of less than 5 microns, each of the drain trenches comprising a dielectric liner of silicon dioxide contacting the substrate and a field plate inside the dielectric liner, wherein the dielectric liners in the drain trenches are thicker in bottom portions of the drain trenches and thinner in the upper portions of the drain trenches;
    a body disposed in the substrate above the vertical drain drift region;
    a gate disposed above the body; and
    a source electrode disposed over the substrate; and
    a termination trench substantially a same depth as the drain trenches, disposed in the substrate, the termination trench surrounding the drain trenches, the termination trench comprising a dielectric liner of substantially uniform thickness contacting the substrate and a field plate inside the dielectric liner; wherein the drain contact region extends under the termination trench, wherein:
    an interior edge of the termination trench is separated from outer instances of the drain trenches by a side space which is 80 percent to 120 percent of the substantially equal spacing between the drain trenches;

the interior edge of the termination trench is separated from ends of instances of the drain trenches located away from the chamfered corners by an end space which is 50 percent to 90 percent of the spacing between the drain trenches;

the vertical MOS transistor has four chamfered corners wherein each chamfered corner extends across at least five of the drain trenches so that the drain trenches at each chamfered corner are shorter than instances of the drain trenches located away from the chamfered corners;

at each chamfered corner, the termination trench includes at least three external corners and at least two internal corners, wherein the external corners and internal corners alternate in series;

each external corner extends around an end of an instance of the drain trenches which extends past an adjacent instance of the drain trenches, wherein every point on the interior edge of the termination trench is separated from an adjacent instance of the drain trenches by 50 percent to 120 percent of the substantially equal spacing between the drain trenches; and each internal corner extends past an end of an instance of the drain trenches which is recessed from an adjacent instance of the drain trenches, wherein every point on the interior edge of the termination trench is separated from sides and ends of the adjacent drain trenches by 50 percent to 120 percent of the substantially equal spacing between the drain trenches.

* * * * *